US006033236A

United States Patent [19]

McHugh et al.

[11] Patent Number: 6,033,236
[45] Date of Patent: Mar. 7, 2000

[54] SHIELDED CONNECTOR

[75] Inventors: Robert G. McHugh, Evergreen, Colo.; Yu-Ming Ho, Pen-Chiao; Ming-Chuan Wu, Taipei Hsien, both of Taiwan

[73] Assignee: Hon Hai Precision Ind. Co., Ltd., Taipei Hsien, Taiwan

[21] Appl. No.: 08/917,639

[22] Filed: Aug. 22, 1997

[51] Int. Cl.[7] .......... H01R 9/09; H05K 1/00

[52] U.S. Cl. .......... 439/74; 439/607

[58] Field of Search .......... 439/74, 607, 108, 439/101

[56] References Cited

U.S. PATENT DOCUMENTS

| | | | |
|---|---|---|---|
| 4,822,304 | 4/1989 | Herron | 439/610 |
| 5,221,212 | 6/1993 | Davis | 439/108 |
| 5,700,151 | 12/1997 | Korsunsky et al. | 439/74 |
| 5,803,752 | 9/1998 | McHugh | 439/74 |
| 5,813,871 | 9/1998 | Grabbe et al. | 439/108 |
| 5,836,773 | 11/1998 | McHugh et al. | 439/74 |

*Primary Examiner*—Neil Abrams
*Assistant Examiner*—Hae Moon Hyeon

[57] ABSTRACT

A plug connector (10) includes an insulative elongated housing (12) defining an elongated cavity (14) therein along the lengthwise direction. The depth of the cavity (14) is relatively smaller than the full dimension of the height of the housing (12). The housing (12) defines a plurality of passageways (18) extending along the height direction and the front end portion of each passageway (18) inwardly communicates with the cavity (14). Oppositely, the remaining most lower portion of each passageway (18) is exposed to an exterior laterally. Thus, a plurality of elongated contacts (24) are adapted to be insertably received within the corresponding passageways (18), respectively, wherein the front portion (36) of each contact (24) is inwardly exposed to the cavity (14) and the remaining portion (26) of the contact (24) is outwardly exposed to an exterior on two sides of the housing (12). A plurality of raised ribs (60) are disposed on two side surfaces (42) of the housing (12) for providing additional support against a shield plate (40). Two pairs of barbs (30, 32) are provided adjacent two opposite ends of each contact (24) wherein the front barbs (32) provide not only alignment but also retention, and the rear barbs (30) provide not only resistance to vibration occurring thereabout, but also preferred engagement with the shield plate for some specific grounding contact (24).

18 Claims, 5 Drawing Sheets

SHIELDED CONNECTOR

BACKGROUND OF THE INVENTION

1. Field of The Invention

The invention relates to the plug connector for use with a complementary receptacle connector for board-to-board connection, and particularly to the housing of the plug connector which is modified to meet the required higher performance of Electro-magnetic compatibility (EMC).

2. The Related Art

U.S. Pat. No. 5,915,976 filed Feb. 6, 1997, discloses a pair of plug connector and receptacle connector respectively mounted on two parallel spaced PC boards for board-to-board connection. Recently, the distance/space between these two parallel spaced boards are desired to be increased, and therefore, either the plug connector or the receptacle connector needs to increase the height thereof for providing such desired spaced between these two board. Unfortunately, because the dimensions including the length and width of the connector are so small that the relatively dimension of the increased height of the connector may influence the desired strength or/and configuration which is expected in the original low profile design in the aforementioned U.S. Patent.

Two problems have been found when the basic structure of the low profile plug connector disclosed in the aforementioned U.S. Patent, is applied to the high profile design. The first problem is that because the passageways for receiving the contacts therein is so tiny and the height of the housing of the plug connector is relatively large, the molded housing along its two side surfaces may have some staggered convex or concave configurations thereon especially when the contacts are inserted into the passageways of the housing, thus jeopardizing the securement of the contact within the corresponding passageway, uglifying the appearance of the housing, and altering the contact tail lengths which originally should be exposed to the corresponding PC board in a sufficient distance for soldering.

The second experienced problem is that the shield plate can not appropriately attached to the side surface of the housing, thus decreasing the originally desired shielding effect.

Therefore, an object of the invention is to provide a plug connector for use with a complementary receptacle connector for a board-to-board connection wherein such plug connector is much higher than the mating receptacle connector and two shield plates are provided on two side surfaces of the housing of the plug connector.

SUMMARY OF THE INVENTION

According to an aspect of the invention, a plug connector includes an insulative elongated housing defining an elongated cavity therein along the lengthwise direction. The depth of the cavity is relatively smaller than the full dimension of the height of the housing. The housing defines a plurality of passageways extending along the height direction and the front end portion of each passageway inwardly communicates with the cavity. Oppositely, the remaining most lower portion of each passageway is exposed to an exterior laterally. Thus, a plurality of elongated contacts are adapted to be insertably received within the corresponding passageways, respectively, wherein the front portion of each contact is inwardly exposed to the cavity and the remaining portion of the contact is outwardly exposed to an exterior on two sides of the housing. A plurality of raised ribs are disposed on two side surfaces of the housing for providing additional support against a shield plate. Two pairs of barbs are provided adjacent two opposite ends of each contact wherein the front barbs provide not only alignment but also retention, and the rear barbs provide not only resistance to vibration occurring thereabout, but also preferred engagement with the shield plate for some specific grounding contact.

DETAILED DESCRIPTION OF THE PREFERRED EMBODIMENTS

Figure 1:
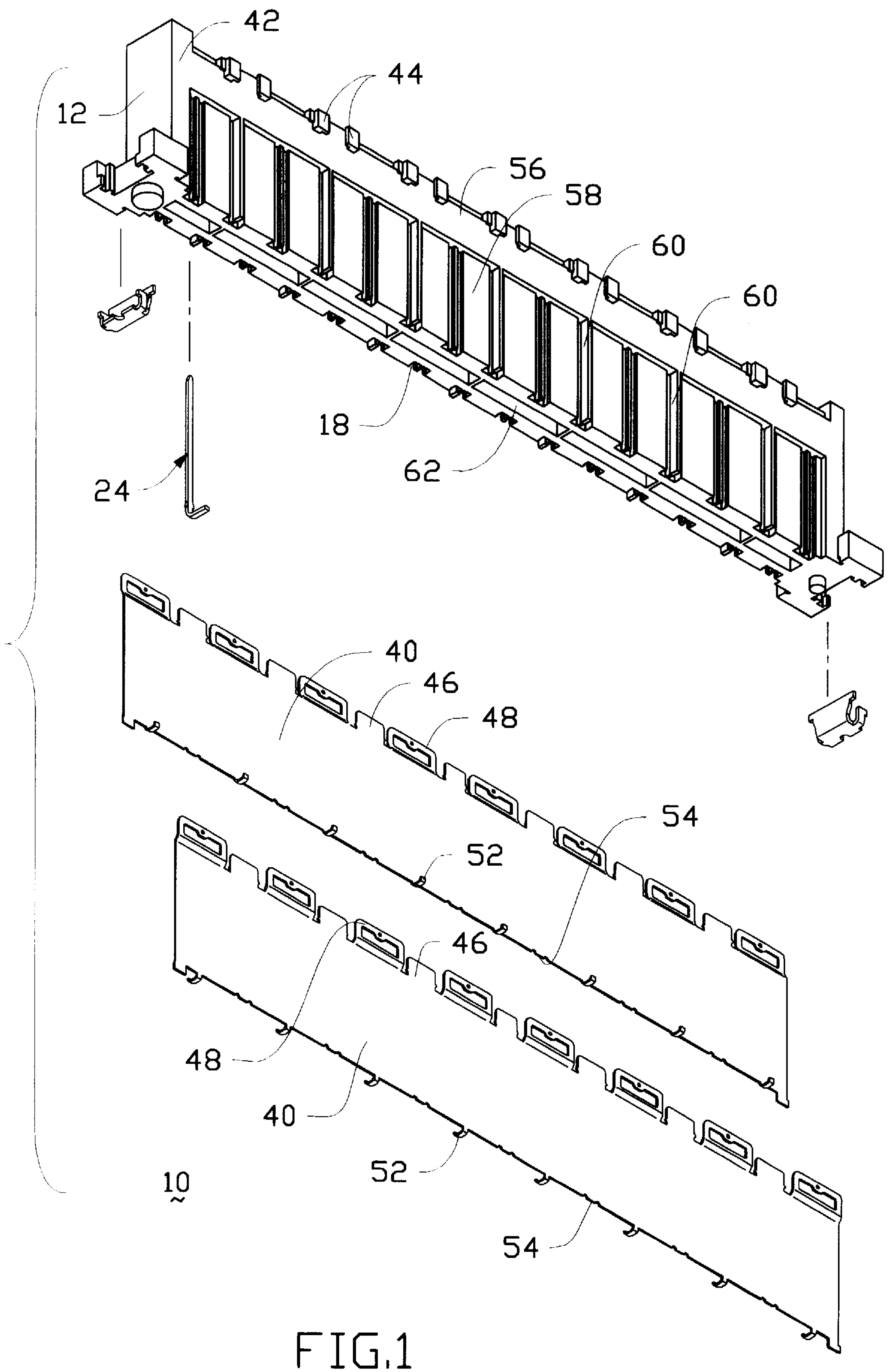
FIG. 1 is an exploded perspective view of a presently preferred e bodiment of a shielded connector, according to the invention.
Figure 2:
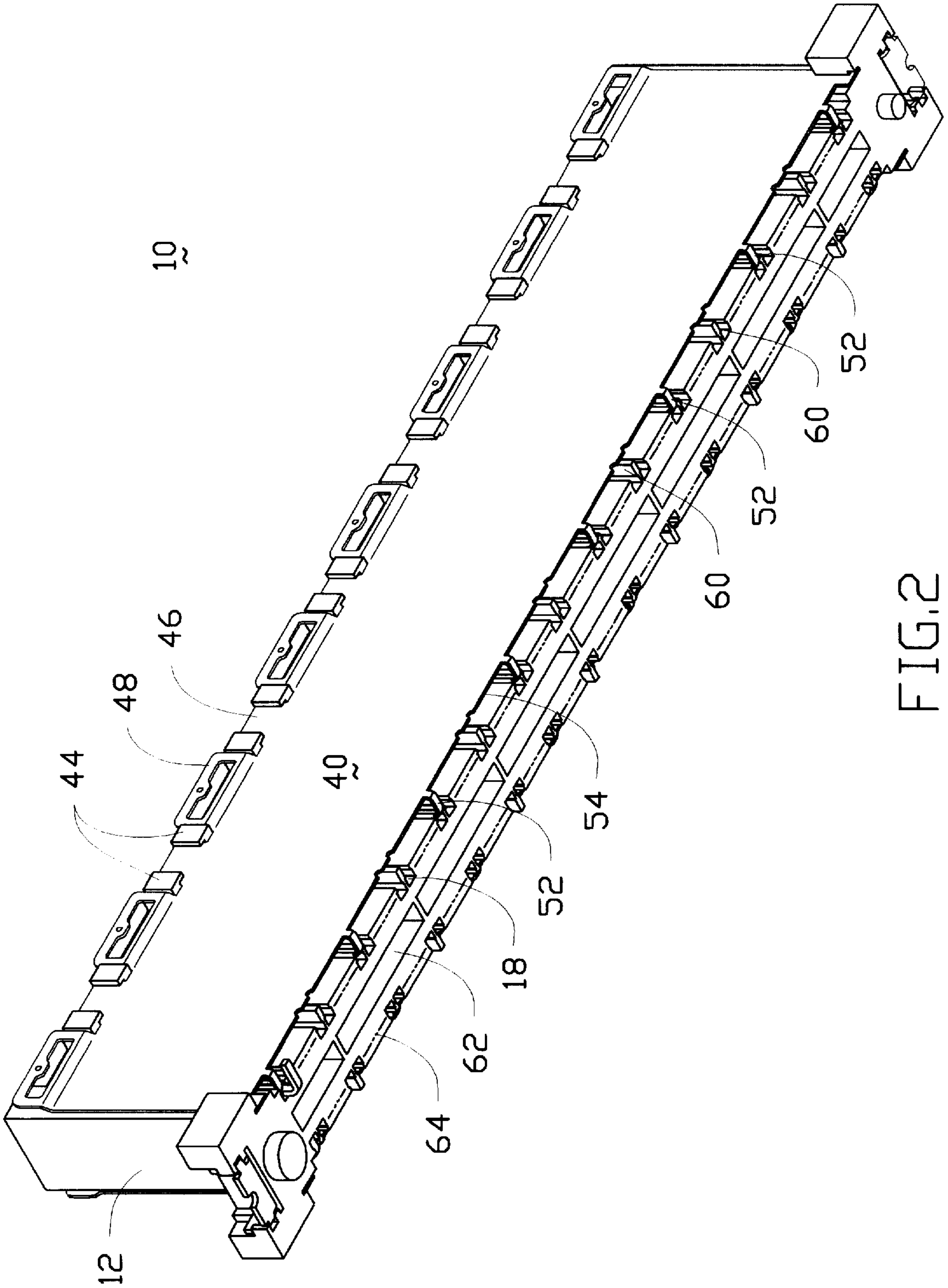
FIG. 2 is a perspective view of the assembled shielded connector of FIG. 1.
Figure 3:
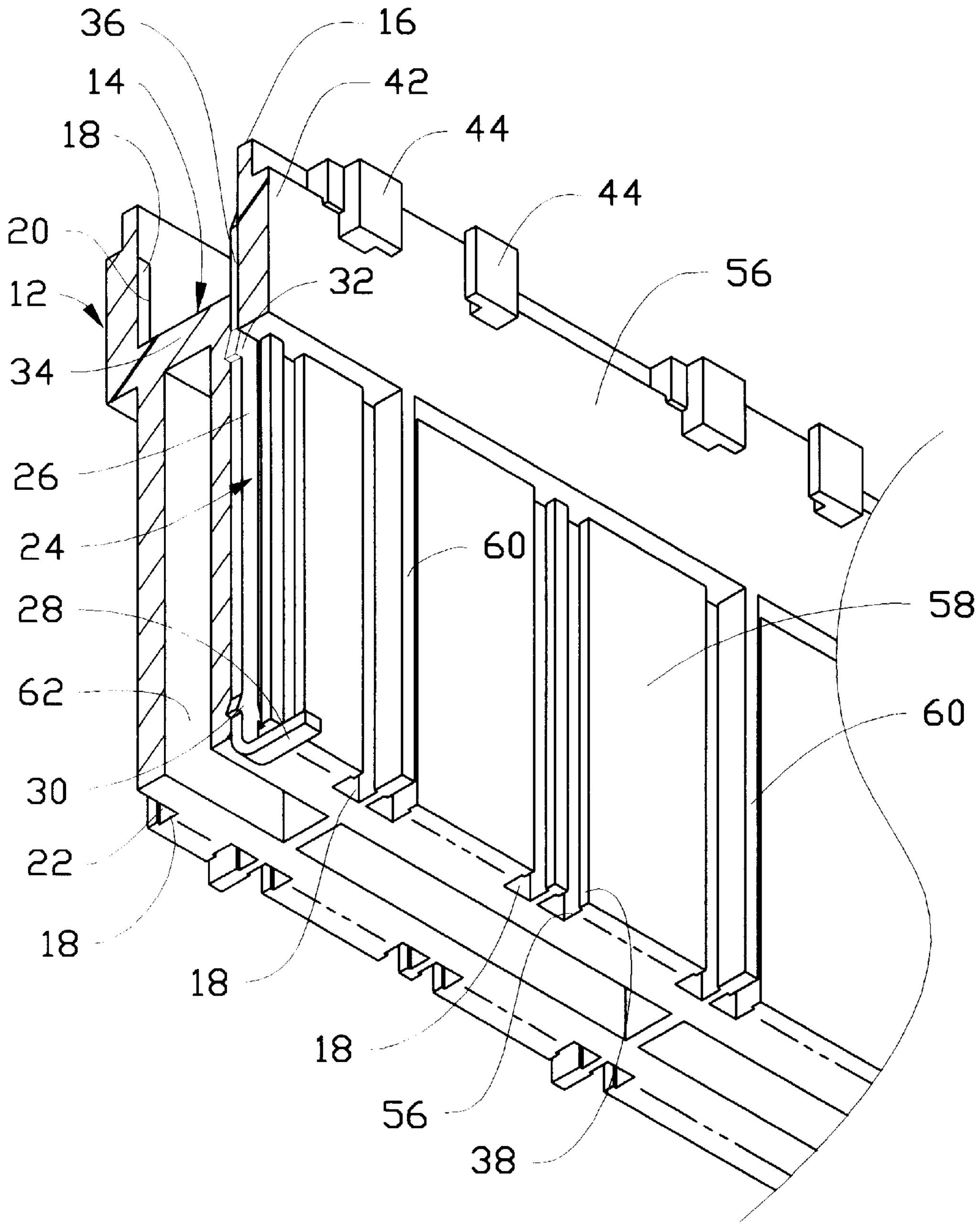
FIG. 3 is an enlarged fragmentary perspective view of the unshielded housing of the connector of FIG. 1 to show the contact and the passageway therein.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 1–4 wherein a shielded connector 10 includes an elongated housing 12 defining an elongated cavity 14, along the lengthwise direction, extending down from its upper surface 16 to a predetermined distance wherein the depth of the cavity 14 is adapted to be mated with a complementary receptacle connector (not shown).

A plurality of side-by-side passageways 18 extend almost a height of the housing 12 wherein the upper section 20 of the passageway 18 confronts and communicates with the cavity 14, and the remaining main lower section 22 of the passageway 18 is exposed to an exterior in the lateral direction. A plurality of contacts 24 are received within the corresponding passageways 18, respectively, wherein each contact 24 includes a long vertical main body 26 generally embedded within the housing 12, and a short horizontal tail 28 laterally outward extending for mounting to a PC board (not shown) on which the connector 10 is seated. The main body 26 of the contact 24 includes a first set of retention barbs 30 positioned proximate the bottom portion of the vertical main body 26 and a second set of retention barbs 32 positioned proximate a horizontal plate 34 under the cavity 14 of the housing 12, whereby the upper engagement section 36 of the main body 26 of the contact 24 substantially faces to the cavity 14 for being adapted to engage the corresponding terminal of the mated complementary connector (not shown), and the remaining most portion of the main body 26 of the contact 24 faces to the outside. It can be seen that the passageway 18 is of a T-shaped cross-section to include a wider inner slot 36 and a narrower outer channel 38 whereby the main body 26 of the contact 24 can be retainably received within the inner slot 36 by means of the barbs 30, 32 thereof.

Figure 5A:
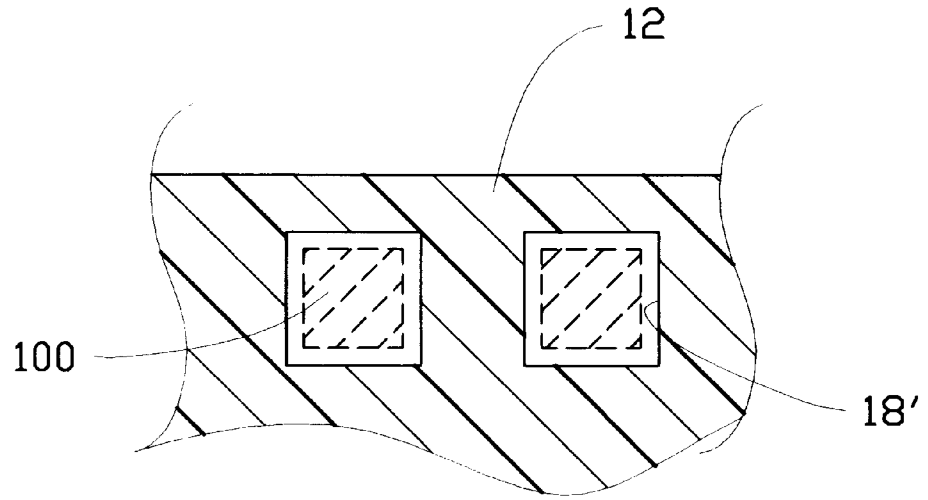
FIG. 5(A) is a partial cross-sectional view of the conventional shielded connector to show how the core pins are received within the passageways of the housing, respectively, for forming/injection molding purpose.
Figure 5B:
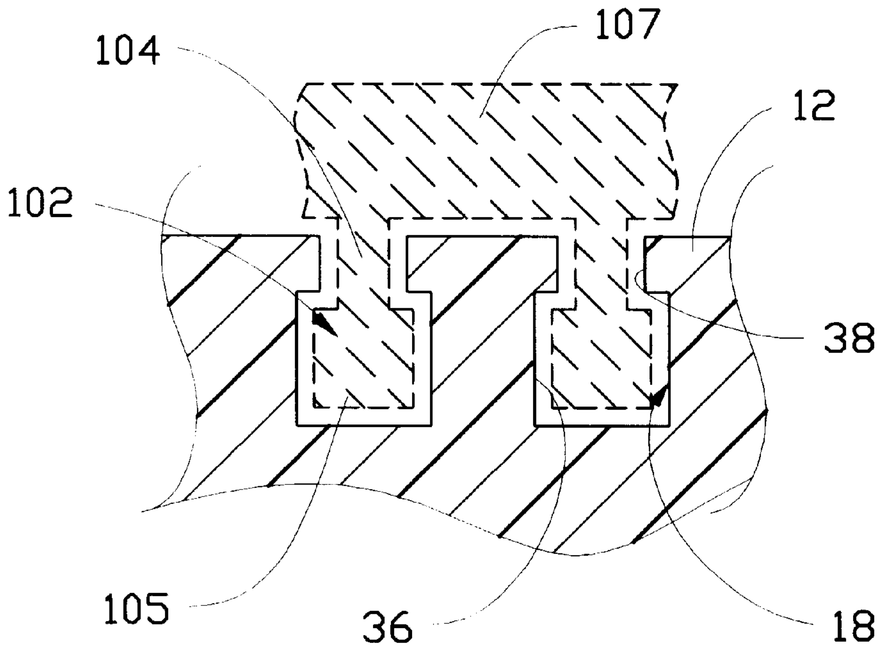
FIG. 5(B) is a partial cross-sectional view of the shielded connector of FIG. 1 of according to the invention to show how the different core pins cooperate with the open type passageways thereof.

It should be noted that in the prior art, because the height of the housing is relatively large and the passageway is substantially of a closed type cross-section as shown in FIG. 5(A), there may be some warpage along the housing 12, thus influencing the appearance of the housing 12 and jeopardizing the retention of the contact within the housing 12. In contrast as shown in FIG. 5(B), in the present invention each passageway 18 has the open outer channel 38 for preventing warpage of the housing 12, thus assuring the housing of its precise dimension.

Figure 4:
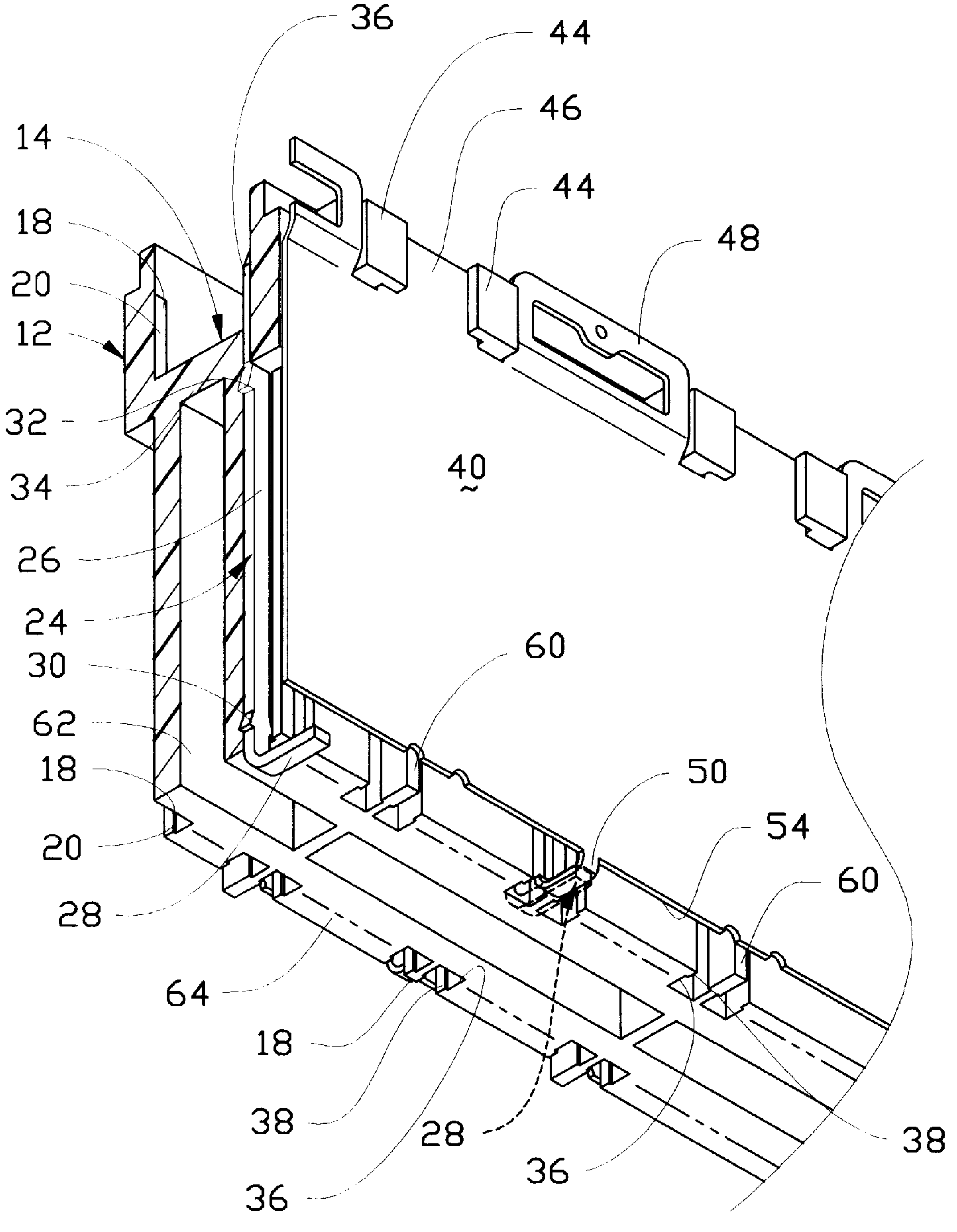
FIG. 4 is an enlarged fragmentary perspective view of the shielded connector of FIG. 1 to show how the shield plate cooperates with the housing and the contacts.

Because of the outer channel 38 of the passageway 18, the main body 26 of the contact 24 is exposed to an exterior without any protective covering of the housing 12. Thus, a shield plate 40 is attached to the side surface 42 of the housing 12 for a shielding purpose. Similar to the foregoing copending application Ser. No. 08/795,753, the housing 12 has pairs of protrusions 44 on either surface 42 for cooperation with the retention blades 46 of the shield plate 40 whereby the shield plate 40 can be secured to the housing 12. Also, as disclosed in the prior copending application, the shield plate 40 further includes plural grounding tangs 48 each positioned between every two adjacent retention blades 46 for facing to a corresponding recess 50 which is adapted to receive a grounding terminal of the complementary receptacle connector (not shown). Disposed opposite to the grounding tang 48 is a grounding pin 52 integrally extending curvilinearly from the bottom edge 54 of the shield plate 40 for electrical and mechanical engagement with the tail 28 of a specific grounding contact 24 of the connector 10 (FIG. 4). Through cooperation of some grounding contacts 24 and the corresponding grounding pins 52 on the shield plate 40 of the subject plug connector 10 and of some corresponding grounding contacts and grounding terminals of the complementary receptacle connector (not shown) and the corresponding grounding tangs 48 of the subject plug connector 10, protection of EMI is obtained efficiently and reliably.

Different from the foregoing copending application, the side surface 42 of the housing 12 has a main plane 56 on the upper portion of the housing 12 which is generally laterally offset with regard to the remaining offset plane 58 of the most lower portion of the housing 12 where the exposed outer channels 38 are located thereabouts. A plurality of spaced raised bars 60 extend on the offset plane 58 to form a coplanar status with the main plane 56. It is understood that through these spaced raised bars 60, the shield plate 40 may properly and evenly cover the side surface 42 of the housing, 12 without any wrinkling phenomena which might be experienced in the copending application using a fully side plane to cooperate with the shield plate.

A plurality of elongated apertures 62 extend upward from the bottom surface 64 of the housing 12 to have the whole structure of the housing uniformed, thus being easy for manufacturing and good for force dispersion when the contacts 24 are retainably received within the corresponding passageways 18, respectively. Understandably, omission of these elongated apertures 62 in the housing 12, i.e., being a solid type housing 12, will not jeopardize the design function of the subject connector 10.

It is noted that because of the barbs 30, the grounding pin 52 of the shield plate 40 can be efficiently engaged with the corresponding grounding contact 24. Moreover, the contact 24 can be snugly supportably received within the corresponding passageway 18, and therefore, the contact 24 can keep a desired plane for better engagement with the corresponding terminal of the complementary connector (not shown).

It can be noted that generally speaking and referring to FIG. 5(A), in a conventional design, the passageway 18' for receiving the contact therein should be in a closed type cross-section configuration so that the contact may be stably and snugly embedded therein. Additionally, the sealed cross-sectional configuration of the passageway may provide a better shielding and protection. While, in this invention and referring to FIG. 5(B), the reason why the passageway 18 has an unsealed cross-sectional configuration with an open outer channel 38, is regarding the molding problem. As known, the housing is formed by the molds and the passageways of the housing are generally formed by spaced core pins of the mold. In the present situation, because the height of the housing 12 is increased, the passageways 18 are substantially of a relatively slender type, thus requiring a plurality of slender core pins of the mold cooperatively forming such longer tiny passageways 18. The relative positions of such plural slender core pins 100 are arranged in a spaced manner from a cross-sectional view wherein such slender core pins 100 commonly fastened to a plane of the mold around the same distal ends of such core pins 100. The slender and thin core pins 100 tend to be tilted under some undesired vibration or impact situation. Therefore, the misaligned core pins may result in false positioning passageways 18'.

Accordingly and oppositely and referring to FIG. 5(B), the invention provides an open type passageways 18 each of which has an outer channel 38, and thus the corresponding core pin 102 of each passageway 18 may not only have the main portion 105 for receipt within the inner slot 36 of each corresponding passageway 18, but also have additional lateral portion 104 for receipt within the outer channel 38 of each corresponding passageway 18, from a cross-sectional view. Therefore, the core pins 102 can be interconnected one another in the lateral direction with an outermost unitary block 107 of the mold, and this provides a very strong mechanism during molding or handling to resist any possible lateral impact. Accordingly, the passageways 18 derived from such reinforced core pins 102 of the mold may keep their true positions without doubt.

It is also be appreciated that even though the passageways 18 are of an open status in the lateral direction, the shield plate 40 is attached to the housing 12 for protectively covering such exposed passageways 18 as mentioned in an earlier time. Therefore, the whole connector is still in a good electrical and physical condition for mating and signal transmission.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A shielded connector including:

an insulative housing defining a cavity for receiving a corresponding mating portion of a complementary connector;

a plurality of passageways extending vertically through the housing for receiving a plurality of contacts therein, respectively, wherein an upper portion of each of said passageways communicatively faces inwardly to the cavity and a remaining other lower portion of each of said passageways communicatively faces outwardly and laterally to an exterior;

wherein each of said passageways has a T-shaped cross-section.

2. The shielded connector as described in claim 1, wherein each of said T-shaped passageways includes a wider inner slot and a narrower outer channel.

3. The shielded connector as described in claim 1, wherein a first dimension of the upper portion of each of said passageways is much smaller than a second dimension of the lower portion of each of said passageways.

4. The shielded connector as described in claim 1, wherein the housing includes two side surfaces and each of said side surfaces includes a main plane which is laterally outward offset from an offset plane with which the lower portion of each of said passageways communicates.

5. The shielded connector as described in claim 4, wherein a plurality of raised bars are generally at equal intervals disposed on the offset plane.

6. The shielded connector as described in claim 1, wherein each of said contacts includes a first set of barbs positioned around a bottom portion of a vertical main body and a second set of barbs positioned around a horizontal plate under the cavity of the housing.

7. The shielded connector as described in claim 1, wherein some of said contacts are grounding contacts, and a shield plate has a plurality of grounding pins and grounding tangs in alignment with said grounding contacts, respectively.

8. The shielded connector as described in claim 1, wherein a plurality of apertures extend upward from a bottom surface of the housing.

9. A shielded connector comprising:

an insulative housing defining a height relatively much larger than a lateral width;

a cavity formed in an upper portion of the housing having a depth much smaller than said height;

a plurality of contacts side by side disposed along the housing wherein an upper portion of each of said contact faces inwardly to the cavity, and a remaining lower portion of each of said contacts faces outwardly to an exterior; wherein each of said contacts is embedded within a corresponding passageway whereby said contact is communicatively open to the exterior but does not extend beyond an offset plane of the side surface of the housing.

10. The shielded connector as described in claim 9, wherein at least a shield plate is securely attached to one side surface whereby the contacts are no longer exposed to the exterior.

11. The shielded connector as described in claim 9, wherein a first set of barbs are formed around a bottom portion of a vertical main body of each of said contacts, and a second set of barbs are formed around the upper portion of each of said contacts.

12. A shielded connector comprising:

an insulative housing defining a height having a dimension being substantially twice that of a width;

a cavity formed in an upper portion of the housing wherein a depth of said cavity is generally equal to the width of the housing; and at least a shield plate securely attached to one side surface of the housing to cover full area thereof;

wherein an offset plane is spaced from the shield plate by a plurality of raised bars, and wherein a plurality of contacts are embedded within a corresponding number of laterally open passageways and thus are protectively covered by the shield plate for segregation from an exterior.

13. A shielded connector including:

an insulative housing defining a cavity for receiving a corresponding mating portion of a complementary connector;

a plurality of passageways extending vertically through the housing for receiving a plurality of contacts therein, respectively wherein an upper portion of each of said passageways communicatively faces inwardly to the cavity and a remaining other lower portion of each of said passageways communicatively faces outwardly and laterally to an exterior;

wherein each of said passageways has a T-shaped cross-section including a wider inner slot and a narrower outer channel.

14. A shielded connector including:

an insulative housing defining a cavity for receiving a corresponding mating portion of a complementary connector;

a plurality of passageways extending vertically through the housing for receiving a plurality of contacts therein, respectively wherein an upper portion of each of said passageways communicatively faces inwardly to the cavity and a remaining other lower portion of each of said passageways communicatively faces outwardly and laterally to an exterior;

wherein the insulative housing includes two side surfaces and each of said side surfaces includes a main plane which is laterally outward offset from an offset plane with which the lower portion of each of said passageways communicates.

15. A shielded connector including:

an insulative housing defining a cavity for receiving a corresponding mating portion of a complementary connector;

a plurality of passageways extending vertically through the housing for receiving a plurality of contacts therein, respectively wherein an upper portion of each of said passageways communicatively faces inwardly to the cavity and a remaining other lower portion of each of said passageways communicatively faces outwardly and laterally to an exterior;

wherein each of said contacts includes a first set of barbs positioned around a bottom portion of a vertical main body and second set of barbs positioned around a horizontal plate under the cavity of the housing.

16. A shielded connector including:

an insulative housing defining a cavity for receiving a corresponding mating portion of a complementary connector;

a plurality of passageways extending vertically through the housing for receiving a plurality of contacts therein, respectively wherein an upper portion of each of said passageways communicatively faces inwardly to the cavity and a remaining other lower portion of each of said passageways communicatively faces outwardly and laterally to an exterior;

wherein a plurality of apertures extend upward from a bottom surface of the housing.

17. A shielded connector comprising:

an insulative housing defining a height relatively much larger than a lateral width;

a cavity formed in an upper portion of the housing having a depth much smaller than said height;

a plurality of contacts side by side disposed along the housing wherein an upper portion of each of said contacts faces inwardly to the cavity, and a remaining lower portion of each of said contacts faces outwardly to an exterior;

wherein a first set of barbs are formed around a bottom portion of a vertical main body of each of said contacts, and a second set of barbs are formed around the upper portion of each of said contacts.

18. A shielded connector comprising:

an insulative housing defining a height relatively much larger than a lateral width;

a cavity formed in an upper portion of the housing having a depth much smaller than said height;

a shield plate;

a plurality of contacts side by side disposed along the housing wherein an upper portion of each of said contacts faces inwardly to the cavity, and a remaining lower portion of each of said contacts faces outwardly to an exterior;

wherein each of said contacts is embedded within a corresponding passageway whereby said contact is communicatively open to the exterior but does not extend beyond an offset plane of the side surface of the housing.

* * * * *